United States Patent
Mouli (10) Patent No.: US 7,385,259 B2
(45) Date of Patent: Jun. 10, 2008

(54) METHOD OF MANUFACTURING A MULTILAYERED DOPED CONDUCTOR FOR A CONTACT IN AN INTEGRATED CIRCUIT DEVICE

(75) Inventor: Chandra V. Mouli, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/627,067

(22) Filed: Jan. 25, 2007

(65) Prior Publication Data

US 2007/0114615 A1    May 24, 2007

Related U.S. Application Data

(62) Division of application No. 10/989,530, filed on Nov. 16, 2004, now Pat. No. 7,195,995, which is a division of application No. 10/650,563, filed on Aug. 28, 2003, now Pat. No. 6,858,534, which is a division of application No. 10/230,948, filed on Aug. 29, 2002, now Pat. No. 6,670,682.

(51) Int. Cl.
H01L 29/76 (2006.01)
H01L 29/94 (2006.01)
H01L 31/00 (2006.01)

(52) U.S. Cl. ............... 257/382; 257/751; 257/E29.064
(58) Field of Classification Search ............... 257/382, 257/751, E29.064
See application file for complete search history.

(56) References Cited

U.S. PATENT DOCUMENTS

| 5,882,993 | A | 3/1999 | Gardner et al. |
| 5,976,961 | A | 11/1999 | Jung et al. |
| 5,981,332 | A | 11/1999 | Mandelman et al. |
| 6,066,894 | A | 5/2000 | Yokozeki |
| 6,067,680 | A | 5/2000 | Pan et al. |
| 6,130,145 | A | 10/2000 | Ilg et al. |
| 6,177,697 | B1 | 1/2001 | Cunningham |
| 6,225,214 | B1 | 5/2001 | Lin |
| 6,319,804 | B1 | 11/2001 | Greenlaw et al. |
| 6,323,525 | B1 | 11/2001 | Noguchi et al. |
| 6,392,303 | B2 | 5/2002 | Keeth |
| 6,410,951 | B2 | 6/2002 | Fischer et al. |
| 6,737,308 | B2 | 5/2004 | Kim |
| 2005/0082539 | A1* | 4/2005 | Fujimoto et al. ............. 257/72 |
| 2005/0243601 | A1* | 11/2005 | Harari ..................... 365/185.3 |

* cited by examiner

Primary Examiner—Ngân V. Ngô
(74) Attorney, Agent, or Firm—Dinsmore & Shohl LLP (57) ABSTRACT

A method of manufacturing a memory device addressing reliability and refresh characteristics through the use of a multilayered doped conductor, and a method making is described. The multilayered doped conductor creates a high dopant concentration in the active area close to the channel region. The rich dopant layer created by the multilayered doped conductor is less susceptible to depletion from trapped charges in the oxide. This improves device reliability at burn-in and lowers junction leakage, thereby providing a longer period between refresh cycles.

20 Claims, 12 Drawing Sheets

METHOD OF MANUFACTURING A MULTILAYERED DOPED CONDUCTOR FOR A CONTACT IN AN INTEGRATED CIRCUIT DEVICE

CROSS REFERENCE TO RELATED APPLICATIONS

This application is a division of U.S. patent application Ser. No. 10/989,530 filed Nov. 16, 2004 now U.S. Pat. No. 7,195,995, now allowed, which in turn is a division of U.S. patent application Ser. No. 10/650,563 filed Aug. 28, 2003, now U.S. Pat. No. 6,858,534, issued on Feb. 22, 2005, which in turn is a division of U.S. patent application Ser. No. 10/230,948 filed Aug. 29, 2002, now U.S. Pat. No. 6,670,682, issued on Dec. 30, 2003.

BACKGROUND OF THE INVENTION

The present invention relates to the field of semiconductor memory devices, and more particularly, to a structure having improved burn-in reliability and refresh characteristics in dynamic random access memory (DRAM) devices and a method of making it.

Metal oxide semiconductor (MOS) structures are basic electronic devices used in many integrated circuit (IC) devices. One such structure is the metal oxide semiconductor field effect transistor (MOSFET), which is typically formed in a semiconductor substrate by providing a gate structure over the substrate to define a channel region, and by forming source/drain regions on opposing sides of the channel region. To keep pace with the current trend toward maximizing the number of circuit devices contained in a single chip, integrated circuit designers continue to design IC devices with smaller and smaller feature sizes. The current state of the art for production MOSFET devices includes physical gate lengths of less than about 0.18 micron (µm).

Figure 1:
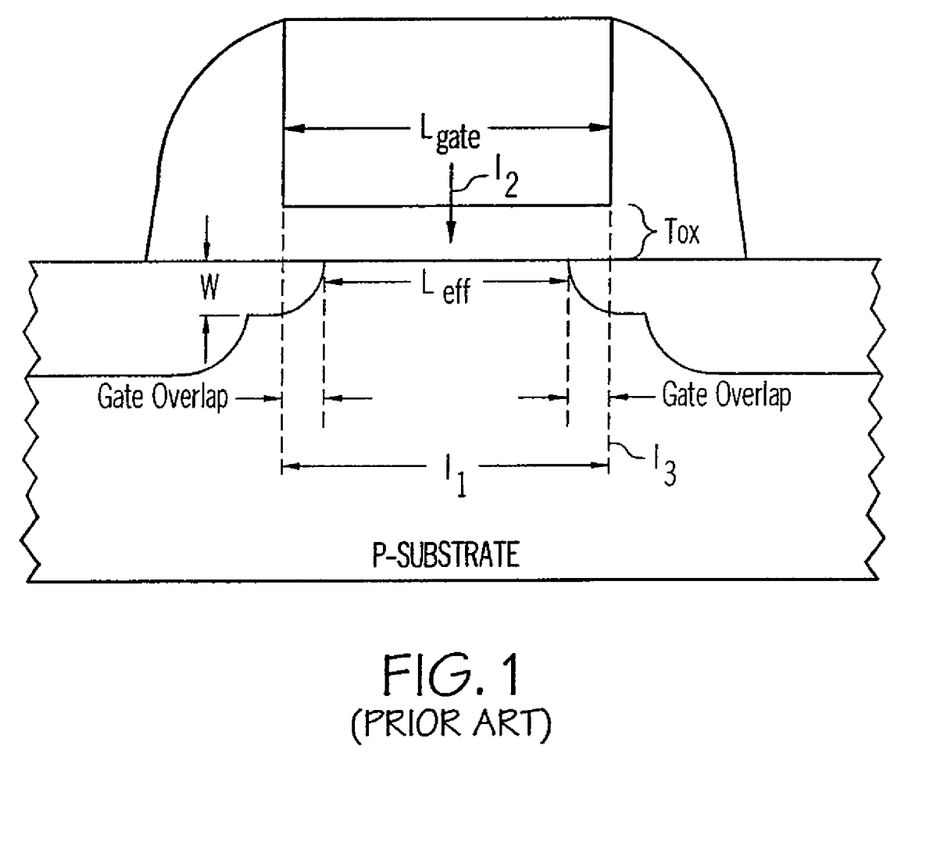
FIG. 1 is a cross section view of a typical MOSFET showing off-current leakage components.

To help explain problems associated with prior art MOSFET structures, a cross section of a typical MOSFET device is shown in FIG. 1. In addition, various components of device leakage current are schematically represented. The total device leakage current, $I_{off}$, is comprised of three major components: device off-current $I_1$, gate leakage $I_2$, and thermal and tunneling junction leakage $I_3$. The device off-current $I_1$, is determined by the physical gate length $L_{gate}$ and the channel width (W) of the device, with the gate voltage $V_g$=0 V, the drain voltage ($V_d$)=power-supply voltage ($V_{dd}$), and the source voltage ($V_s$) to ground. The gate leakage current, $I_2$, is determined by the gate-oxide thickness ($T_{ox}$), power-supply voltage ($V_{dd}$), and the total gate area ($L_{gate} \times W$). The thermal and tunneling junction leakage, $I_3$, is determined by the operating temperature of the device and the total doping level in the substrate, which is one reason the lightly doped regions are typically placed adjacent the channel region in order to minimize junction leakage. The device off-state leakage current, $I_{off}$, also known as the subthreshold leakage current, is a function of $L_{gate}$, temperature (T), and power-supply voltage ($V_{dd}$). The subthreshold leakage current of a MOS transistor with a physical gate length ($L_{gate}$) of less than 0.18 µm exhibits what is called drain induced barrier lowering (DIBL) effect. The DIBL effect results in: (1) the leakage current changing exponentially in proportion to the drain voltage as well as the gate voltage, and (2) with the increase in the substrate bias, the drain voltage dependency increases.

As the channel lengths of MOSFET devices have been reduced below 0.18 µm, MOSFETS have become more susceptible to certain problems. One common problem is increased junction leakage $I_3$, which affects the refresh characteristics of a dynamic random access memory (DRAM) cell. DRAM is a specific category of random access memory (RAM) containing an array of individual memory cells, where each memory cell includes a capacitor for holding a charge and a transistor for accessing the charge held in the capacitor. Due to junction leakage, the stored charge must be refreshed in the capacitor on a periodic basis. Increased junction leakage leads to a premature depletion of the capacitor's stored charge, necessitating more frequent refresh cycles in such DRAM devices.

Additionally, with gate lengths of less than 0.18 µm, the width of the gate overlap region (FIG. 1) in such transistors should be as small as possible due to very tight limitations on allowable sub-threshold leakage currents. Having a smaller gate overlap region width provides an effective gate length that is as large as possible for a given physical gate length, which reduces drain-induced barrier lowering. Reducing drain-induced barrier lower improves the refresh characteristics for DRAM devices with gate overlap regions of less than 0.018 µm.

However, reducing the width of the gate overlap region is not without consequences. In particular, reducing the width of the gate overlap region worsens the reliability of the DRAM device after a high voltage stress, such as experienced during burn-in. Burn-in is the application of thermal and electrical stresses for inducing the failure of marginal memory devices, those with inherent defects or defects resulting from manufacturing aberrations which cause time and stress dependent failures. During burn-in testing, ambient heat and the heat caused by the current flow under the gate structure of each MOS transistor stress the device by raising the junction temperature. This stress can lead to the premature failure of weaker devices, as the heat of burn-in causes ions in the active regions of each MOS transistor to dissipate to the point where the device can no longer function.

Generally, gate overlap widths greater than 0.02 µm make DRAM devices more robust to reliability stressing, such as burn-in testing, because the gate structure has control over the inversion region directly beneath the gate structure. In such devices, the gate structure can compensate for any charges that are trapped in the gate oxide interface due to the high electrical field. That is, the gate overlap regions are less likely to degrade when high voltage is applied to the device, such as the types of voltages applied during burn-in or other manufacturing stress testing. For an NMOS device having a gate length less than 0.18 µm, a gate-to-substrate voltage greater than the threshold voltage, such as experienced during burn-in, causes the formation of an inversion layer of free electrons (conducting channel) in the p-type substrate. Accordingly, a DRAM device with a gate overlap region width less than 0.018 µm, which places the peak electric field outside the overlap region, results in the gate structure having less control over the inversion region, thereby further degrading device lifetime significantly. It is to be appreciated that device lifetime is generally defined as a percentage change in transconductance or drain saturation current.

Figure 13A:
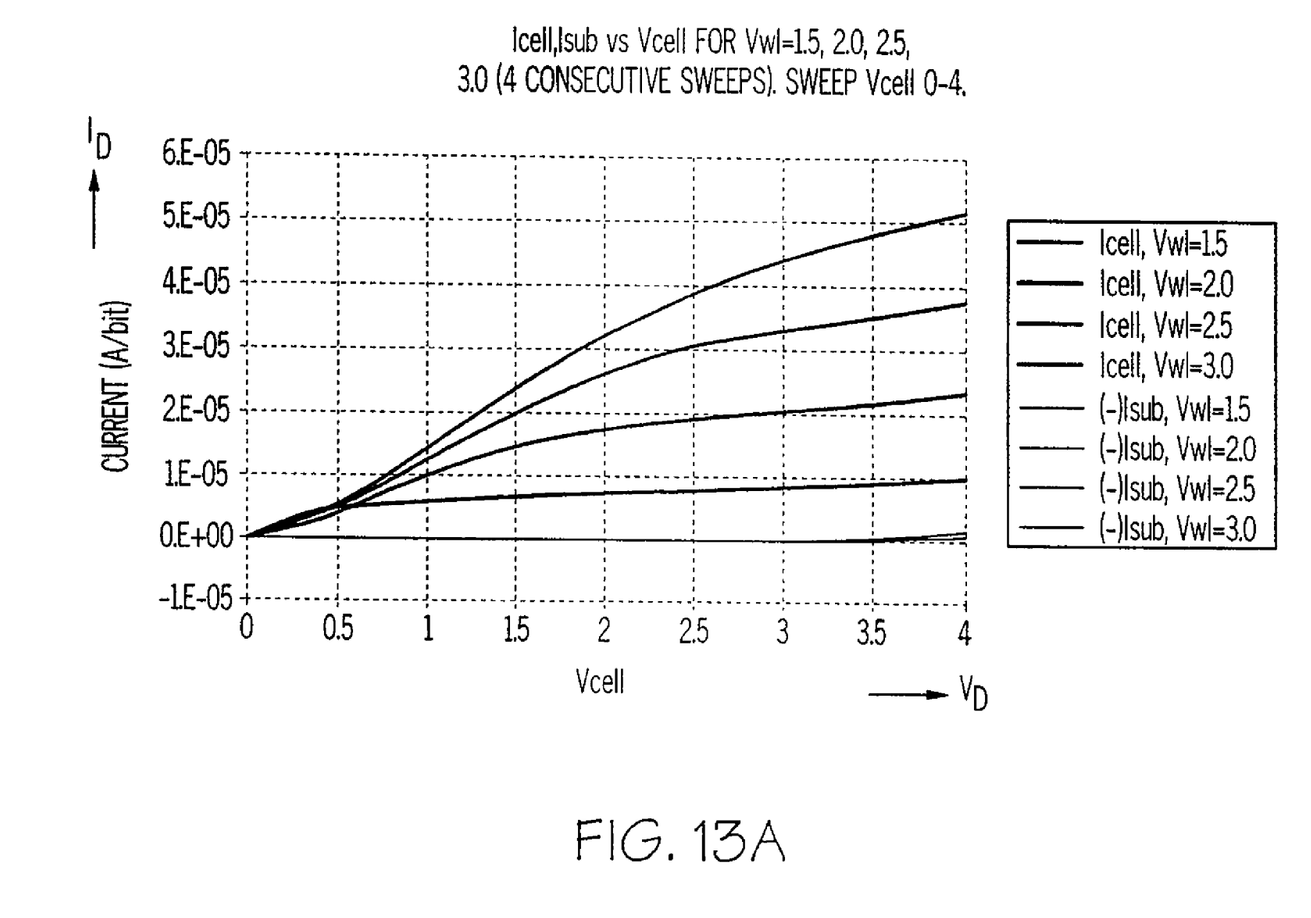
FIGS. 13*a* and 13*b*, are graphs each showing a family of drain current ($I_d$) versus drain voltage ($V_d$) characteristics for different gate voltages ($V_g$).
Figure 13B:
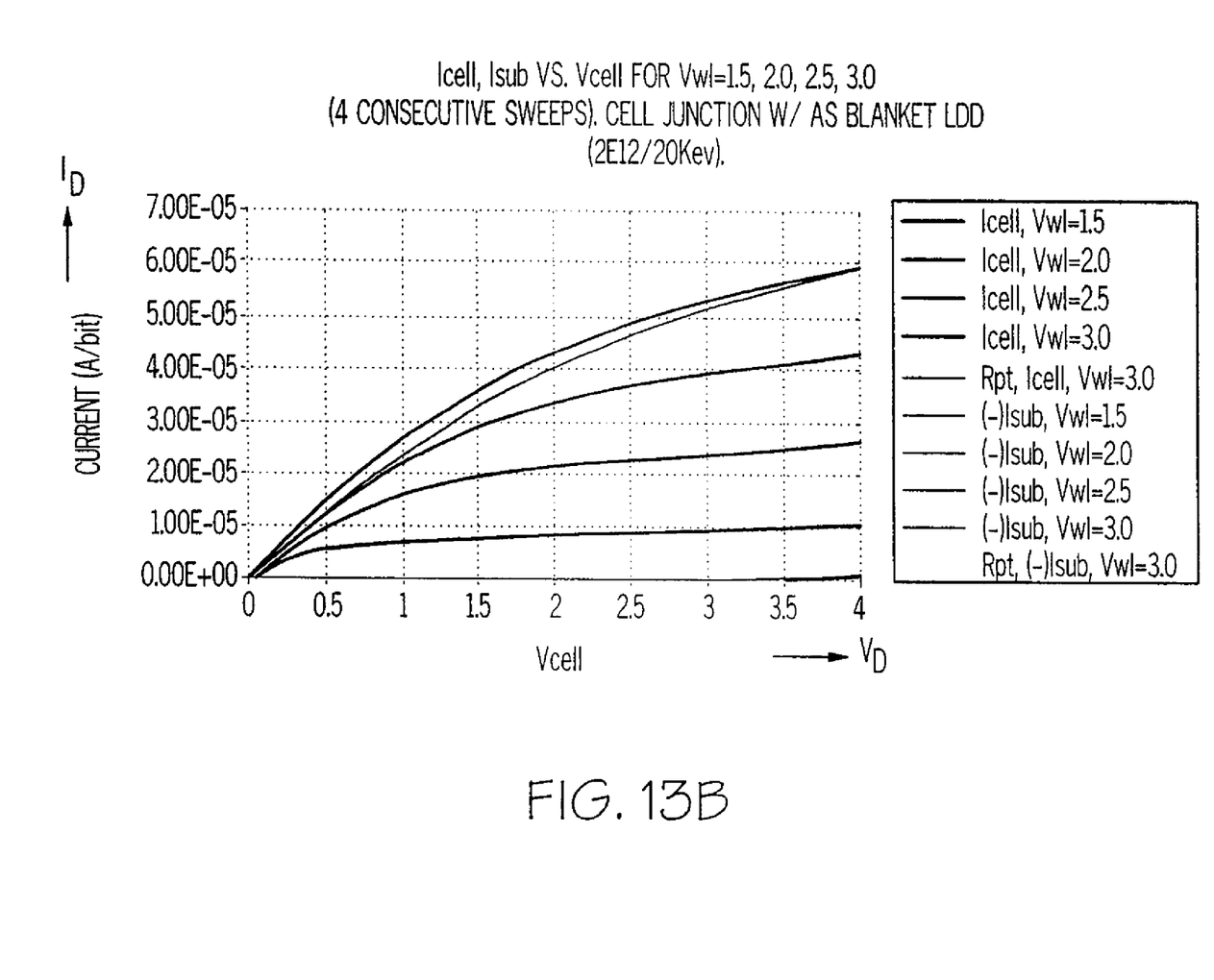

To further illustrate this point, FIGS. 13a and 13b, are graphs each showing a family of drain current ($I_d$) versus drain voltage ($V_d$) characteristics for different gate voltages ($V_g$). FIG. 13a illustrates the $I_d/V_d$ response of a poorly designed device, which shows degradation (i.e., low $I_d$) after the first $V_g$ sweep and is one of the main reasons for failure at burn-in. FIG. 13b, on the other hand, illustrates well-behaved $I_d/V_d$ curves for all $V_g$ sweeps.

As mentioned previously, to reduce junction leakage DRAM devices are often designed so that their source/drain regions have a minimum dopant density. However, a lightly doped source/drain region is easy to deplete even with a small trapped-charge density at the gate oxide interface. Accordingly, device reliability decreases further in devices with gate overlap region widths less than 0.018 µm by increasing the threshold voltage and transconductance after a high voltage stress, such as a device is subjected to during burn-in.

Further aggravating the problems associated with such devices with reduced overlap gate regions, is BPSG poisoning and access device n-sheet resistance. Rich BPSG (boron-phosphosilicate glass) layers are needed for easy re-flow and planarity in the device. This is particularly important in stacked DRAM cell technology where the DRAM capacitor is formed in a very tall stack above the silicon substrate. Thin nitride or TEOS liners are needed for better contact processing, such as for forming precisely sized plug openings. However, TEOS liners can potentially increase the trapped states and interfacial charge density close to the source/drain regions. TEOS liners that reduce the interfacial oxide layer (gate oxide plus reoxidation) thickness in NMOS devices can permit boron from a BPSG layer to diffuse through the thin TEOS liner to compensate the n-type dopant in a source/drain region. This type of diffusion increases the n-sheet resistance of the access device. Such diffusion also decreases device reliability due to hot carriers in compensated regions now having additional states to occupy, thereby further depleting the electron density in the active area of the device.

Accordingly, for DRAM devices having MOSFETs with gate lengths less than 0.18 µm and gate overlaps less than 0.018 µm, there is a continued desire in the industry to improve both the device burn-in reliability and the refresh characteristics of such devices. Improving device reliability during burn-in will increase the overall production yields for such devices, thereby reducing costs and waste. Improving device refresh characteristics by providing a longer refresh cycle, reduces the overhead required to use such DRAM device, and frees up resources that can be expended in other device operations.

SUMMARY OF THE INVENTION

A memory device addressing reliability and refresh characteristics beyond that obtainable from prior art devices, as well as a method of fabricating such a device is described. In particular, the present invention addresses reliability in memory IC devices at burn-in, such for example DRAMs, having gate lengths less than 0.18 µm and a gate overlap less than 0.018 µm through the use of a multilayered doped conductor. The multilayered doped conductor creates a high dopant concentration in the active area close to the channel region. Because device degradation is due, at least in part, to increased trap states close to the channel region, the rich dopant layer created by the multilayered doped conductor is less susceptible to depletion of trapped charges in the oxide. This addresses device reliability at burn-in and lowers junction leakage, thereby permitting a longer period between refresh cycles.

In particular, the present invention in one embodiment discloses an integrated circuit semiconductor device having a substrate with a first surface provided with a gate structure formed thereon. Source/drain regions of the substrate have a first portion with a first dopant at a first dopant concentration on opposite sides of the gate structure. A conductor is provided adjacent the gate structure contacting one of the source/drain regions. The conductor comprises a first conductive layer having a second dopant at a second dopant concentration, and a second conductive layer having a third dopant at a third dopant concentration formed on the first conductive layer.

The present invention in another embodiment discloses an integrated circuit device having a gate electrode overlying a gate oxide layer on a surface of a semiconductor substrate, an oxide layer lying on a surface and sidewalls of the gate electrode, and spacers on sidewalls of the oxide layer. Lightly doped source/drain regions lie within the semiconductor substrate on opposite sides of the gate electrode and extend at least partially beneath the sidewalls of the oxide layer forming an overlap region. A conductor is provided adjacent one of the spacers contacting one of the source/drain regions. The conductor comprises a first conductive layer having a first dopant at a first dopant concentration, and a second conductive layer having a second dopant at a second dopant concentration formed on the first layer. The first dopant diffusivity is less than the second dopant. The first dopant forms a shallow diffusion region in the one of the source/drain regions beneath the conductor, and the second dopant forms a graded dopant concentration in the one of the source/drain regions below and adjacent the shallow diffusion region.

The present invention in still another embodiment discloses an integrated circuit device comprising a gate electrode overlying a gate oxide layer on a surface of a semiconductor substrate, an oxide layer lying on a surface and sidewalls of the gate electrode, and spacers on sidewalls of the oxide layer. Lightly doped source/drain regions are provided within the semiconductor substrate on opposite sides of the gate electrode extending partially underneath the sidewalls of the oxide layer to form an overlap region. Pocket implants are provided underlying the lightly doped source/drain regions in the semiconductor substrate. Heavily doped source/drain regions are provided lying within the semiconductor substrate adjacent to the lightly doped source/drain regions. The device further includes a conductor provided adjacent one of the spacers, which at least partially contacts one of the lightly doped source/drain regions. The conductor comprises a first conductive layer having a first dopant at a first dopant concentration, and a second conductive layer having a second dopant at a second dopant concentration formed on the first conductive layer. The first dopant diffusivity is less than the second dopant, and forms a shallow diffusion region in the source/drain regions beneath the conductor. The second dopant forms a graded dopant concentration in the lightly doped source/drain region below and adjacent the shallow diffusion region.

The present invention in yet another embodiment discloses a DRAM device having a buried capacitor memory bit cell including a substrate having a first surface, a gate structure formed on the first surface. The gate structure comprises a wordline. Lightly doped source/drain regions are formed within the substrate on opposite sides of the gate structure, and a conductor is provided adjacent the gate structure contacting one of the lightly doped source/drain regions forming a portion of a storage node. The conductor comprises a first conductive layer having a first dopant at a first dopant concentration, and a second conductive layer having a second dopant at a second dopant concentration formed on the first conductive layer.

The present invention in a further embodiment discloses a DRAM device having a buried digitline memory bit cell including a substrate having a first surface, a gate structure formed on the first surface. The gate structure comprises a wordline. Lightly doped source/drain regions are formed within the substrate on opposite sides of the gate structure, and a conductor is provided adjacent the gate structure contacting one of the lightly doped source/drain regions forming a portion of a storage node. The conductor comprises a first conductive layer having a first dopant at a first dopant concentration, and a second conductive layer having a second dopant at a second dopant concentration formed on the first conductive layer.

The present invention in another embodiment discloses a processor-based system comprising a processor, and an integrated circuit semiconductor device coupled to the processor. The integrated circuit semiconductor device comprises a substrate having a first surface, and a gate structure formed on the first surface. Source/drain regions are formed within the substrate on opposite sides of the gate structure, wherein each of source/drain regions comprise a first portion having a first dopant at a first dopant concentration. The device further includes a conductor provided adjacent the gate structure contacting one of the source/drain regions. The conductor comprises a first conductive layer having a second dopant at a second dopant concentration, and a second conductive layer having a third dopant at a third dopant concentration formed on the first conductive layer. The second dopant diffusivity is less than the third dopant, wherein the second dopant forms a shallow diffusion region in the source/drain region beneath the conductor. The shallow diffusion region has a fourth dopant concentration greater than the first dopant concentration. The third dopant provides a graded dopant concentration in the source/drain region below and adjacent the shallow diffusion region.

The present invention in another embodiment discloses a method of fabricating an integrated circuit device. The method comprises providing an opening in an insulating layer of a partially completed device to a lightly doped diffusion region. A conductor is provided in the opening and in contact with the lightly doped diffusion region. The conductor has a first conductive layer with a first dopant and a first dopant concentration, and a second conductive layer on the first conductive layer. The second conductive layer has a second dopant at a second dopant concentration.

The present invention in another embodiment, further disclosures a method of fabricating an integrated circuit device. The method comprises providing a layer of a field oxide over the surface of a semiconductor substrate, forming a gate electrode overlying the field oxide layer, and forming a capping layer having sidewalls on the surface and sidewalls of the gate electrode. The method includes implanting a first ion with a first dosage at a first energy sufficient to penetrate through the field oxide layer and into the substrate to form lightly doped source/drain regions in the semiconductor substrate adjacent the gate electrode. Spacers are then formed on sidewalls of the capping layer. An insulating layer is provided over the surface of the substrate. The method further includes providing an opening through the insulating layer to one of the lightly doped source/drain regions, and providing a first conductive layer in the opening and in contact with the one of the lightly doped source/drain regions. The first conductive layer has a first dopant and a first dopant concentration. A second conductive layer is provided on the first conductive layer. The first and second conductive layers form a conductor adjacent the spacer. The second conductive layer has a second dopant at a second dopant concentration. The first dopant diffusivity is less than the second dopant, wherein the first dopant forms by solid-state diffusion a shallow diffusion region in the lightly doped source/drain region beneath the conductor. The shallow diffusion region has a dopant concentration greater than the lightly doped source/drain region. The second dopant provides a graded dopant concentration in a portion of the lightly doped source/drain regions by diffusing below and adjacent the shallow diffusion region. The method includes continued processing to form the integrated circuit device.

In still another embodiment, a conductor for a semiconductor substrate is disclosed. The conductor comprises a first conductive layer on the semiconductor substrate, a first dopant within the first layer, a second conductive layer adjacent the first layer, and a second dopant within the second layer.

These and other features and advantages of the invention will be more fully understood from the following description of some embodiments of the invention taken together with the accompanying drawings. It is noted that the scope of the claims is defined by the recitations therein and not by the specific discussion of features and advantages set forth in the present description.

BRIEF DESCRIPTION OF THE DRAWINGS

The following detailed description of the embodiments of the present invention can be best understood when read in conjunction with the following drawings, where like structure is indicated with like reference numerals, and in which.

The figures representing portions of an integrated circuit are not drawn to scale, but instead are drawn to illustrate features of the invention.

DETAILED DESCRIPTION OF THE PREFERRED EMBODIMENTS

A sub-micron semiconductor device addressing burn-in reliability and refresh characteristics and methods of fabricating such a device are described. The device includes a MOS transistor having two-layer doped polysilicon plug. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, known materials or methods are not described in detail to avoid unnecessarily obscuring the present invention.

Additionally, it should be noted that the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention.

Furthermore, no particular order is required for the method steps described below, with the exception of those logically requiring the results of prior steps, for example formation of spacers 32 adjacent to the sidewalls of the gate structure 22 logically requires the prior formation of the gate structure and its sidewalls. Otherwise, enumerated steps are provided below in an exemplary order which may be altered, for instance the several ion implant steps may be rearranged using masking and etching steps as are known in the art.

Moreover, it should be noted that although the following described embodiments showing only the N-channel metal oxide field effect transistor (MOSFET) portion of a CMOS integrated circuit device for purposes of reducing complexity of illustration, other arrangements of p-type wells, n-type wells, and combinations of the two with many different doping levels may be used and still preserve the essence of the present invention. Moreover, it is well understood by those skilled in the art that the P-channel portion of a CMOS integrated circuit device can be formed by simply substituting opposite polarities to those given for the N-channel embodiments.

Figure 2:
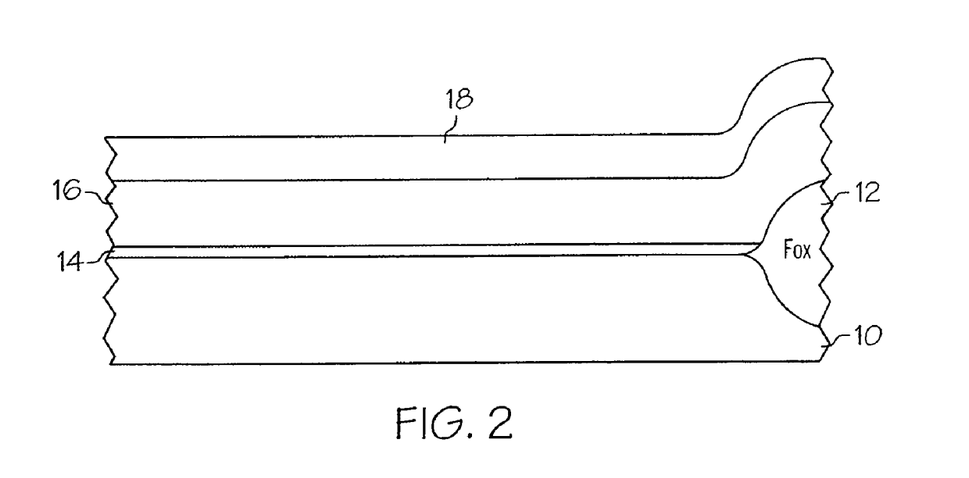
FIGS. 2-8 are diagrams showing, in cross-section, some of the major steps in the manufacture of a semiconductor integrated circuit device in accordance with various embodiments of the present invention.

Referring to FIG. 2, a semiconductor substrate fragment at an early processing stage is indicated generally by reference numeral 10. The process begins with shallow trench isolation of substrate 10, which can be any semiconductor material, including, for example, gallium arsenide (GaAs), silicon (Si), strained silicon, germanium (Ge), silicon-germanium (SiGe), silicon-on-insulator (SOI), silicon-on-sapphire (SOS), doped and undoped semiconductors, epitaxial layers of silicon supported by a base semiconductor foundation, and other semiconductor structures.

Field oxide regions 12 are formed to isolate active areas in which semiconductor devices, such as a transistor, can then be provided in the mesas according to the following processes. In the illustrated embodiment, substrate 10 is a p-type silicon substrate, and the field oxide regions 12 are made of a thermal oxide film having a thickness of from about 2000 to about 5000 Angstroms. The surface of the substrate 10 is thermally oxidized to form the desired gate oxide 14 thickness. The thickness of gate oxide 14 may be from about 30 to about 200 Angstroms.

A polysilicon or polycide layer 16 is deposited, for example, by low-pressure chemical vapor deposition (LPCVD), to a thickness of from between about 1000 to about 4000 Angstroms. A higher conductivity silicide layer 18 is formed over the polysilicon or polycide layer 16 to a thickness of from between about 300 to 600 Angstroms, resulting in the structure illustrated in FIG. 2.

Figure 3:
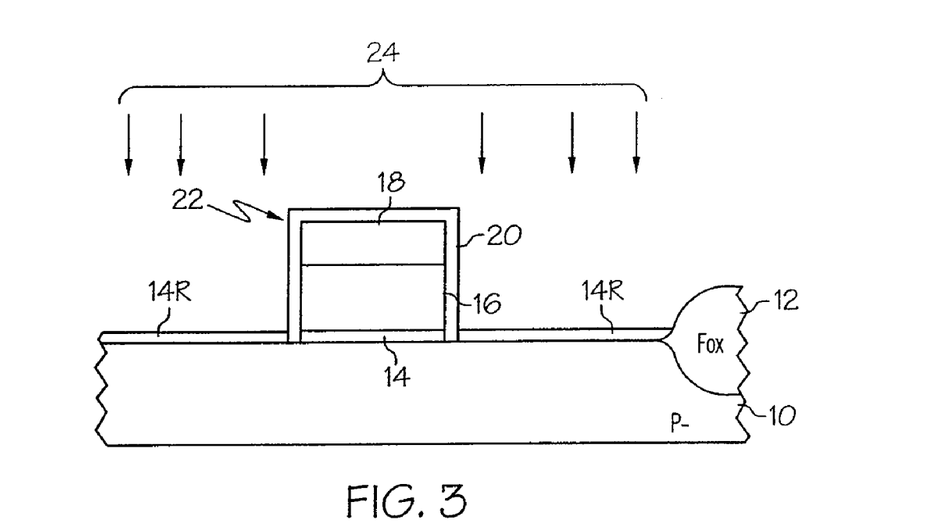

Referring to FIG. 3, a layer of photoresist (not shown) is applied over the silicide layer 18 and patterned to form a photoresist mask where gate electrodes and/or interconnecting lines are to be formed. The gate oxide 14, the polysilicon or polycide layer 16, and the silicide layer 18 are etched away in areas not covered by the mask. An insulating capping layer 20 is then grown or deposited on the top and sidewalls of the remaining layers 14, 16, and 18 to a thickness of between from about 100 to about 200 Angstroms, forming gate structure 22. Capping layer 20 may be a silicon nitride or other insulating material, such that gate structure 22 functions as a word line in a DRAM cell.

The substrate then undergoes a re-oxidation to re-grow field oxide 14R, wherein gate oxide 14 in the gate structure 22 is the gate oxide. Next, lightly doped source and drain (LDD) regions are formed in the substrate 10 adjacent the channel region. The lightly doped drain (LDD) N-regions are formed by implanting ions 24, selected from phosphorus, arsenic, and antimony ions, at energies within ranges that are conventional in the art to achieve a selected source and drain impurity ion amount.

Figure 4:
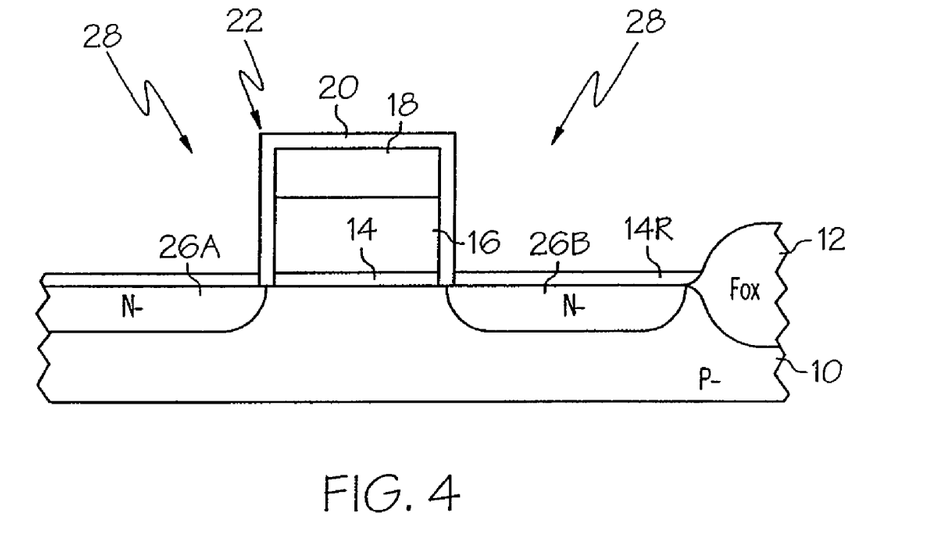

Typically, ions are implanted with dosages of from between about $1\times10^{13}$ to $1\times10^{14}$ atoms/cm2 at energies of between about 5 to 80 KeV at a vertical angle to provide an average dopant concentration for the LDD regions ranging from about $1\times10^{17}$ ions/cm$^3$ to $1\times10^{19}$ ions/cm$^3$. The ion implantation forms lightly doped N-regions 26A and 26B, on respective sides of the gate structure 22, as illustrated in FIG. 4. For LDD P-regions, boron, boron bifluoride ($BF_2$), or borane ($B_2H_{10}$) ions are used.

Figure 5:
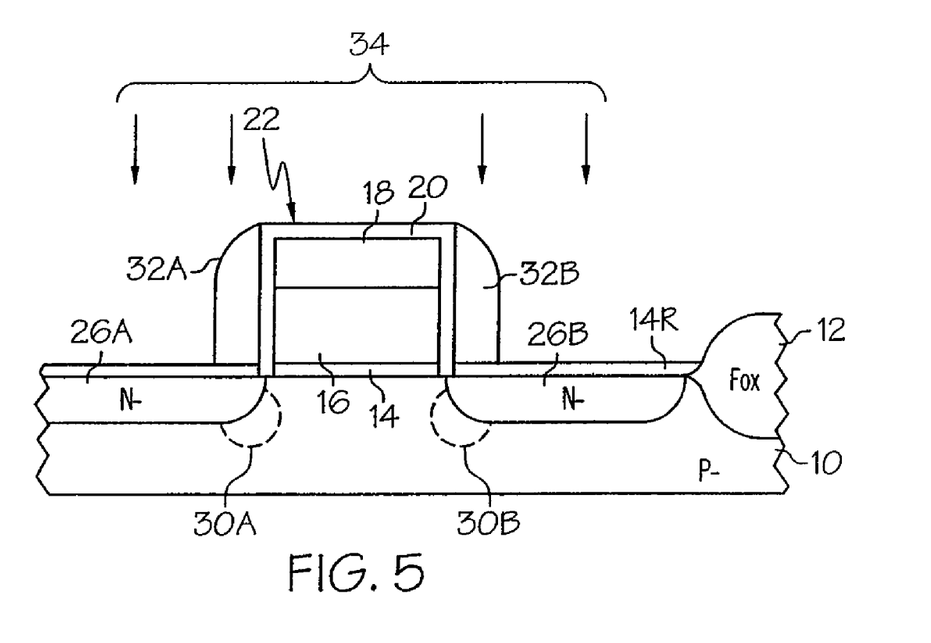

Referring to FIG. 4, a small pocket of a dopant concentration may optionally be implanted on one or both sides of the gate structure 22 by P-ions 28. In the illustrated embodiment, boron, $BF_2$, or $B_2H_{10}$ ions are implanted with dosages of between about $1\times10^{13}$ to $1\times10^{14}$ atoms/cm$^2$ at energies higher than those used for the LDD implantation, at between about 60 to 120 KeV, and at a tilt angle of between about 0° to about 40°. The pockets 30A and 30B are illustrated in FIG. 5, which are counter-dopants only in the small critical region around the LDD regions 26A and 26B. Pockets 30A and 30B effectively suppress the high electrical field regions that cause punch-through.

A material layer is then deposited and partially etched away to leave spacers 32A and 32B on the sidewalls of the gate structure 22, as shown in FIG. 5. The spacers 32A and 32B may have a base width from about 100 to about 500 Angstroms, and comprise silicon oxide, silicon nitride, or any other suitable spacer material.

Next, heavily doped source and drain (HDD) regions may optionally be formed by the ion implantation of N+ ions 34. Ions selected from phosphorus, arsenic, antimony ions and the like are implanted at energies within ranges that are conventional in the art to achieve a selected source and drain impurity ion amount. Typically, N+ ions are implanted at dosages of between about $1\times10^{14}$ to about $8\times10^{15}$ atoms/cm$^2$, and at energies of between about 5 to about 80 KeV at a vertical angle to provide an average dopant concentration for the diffusion regions ranging from about $1\times10^{17}$ ions/cm$^3$ to $1\times10^{19}$ ions/cm$^3$. For HDD P+regions, boron, boron bifluoride ($BF_2$), or borane ($B_2H_{10}$) ions are used.

Figure 6:
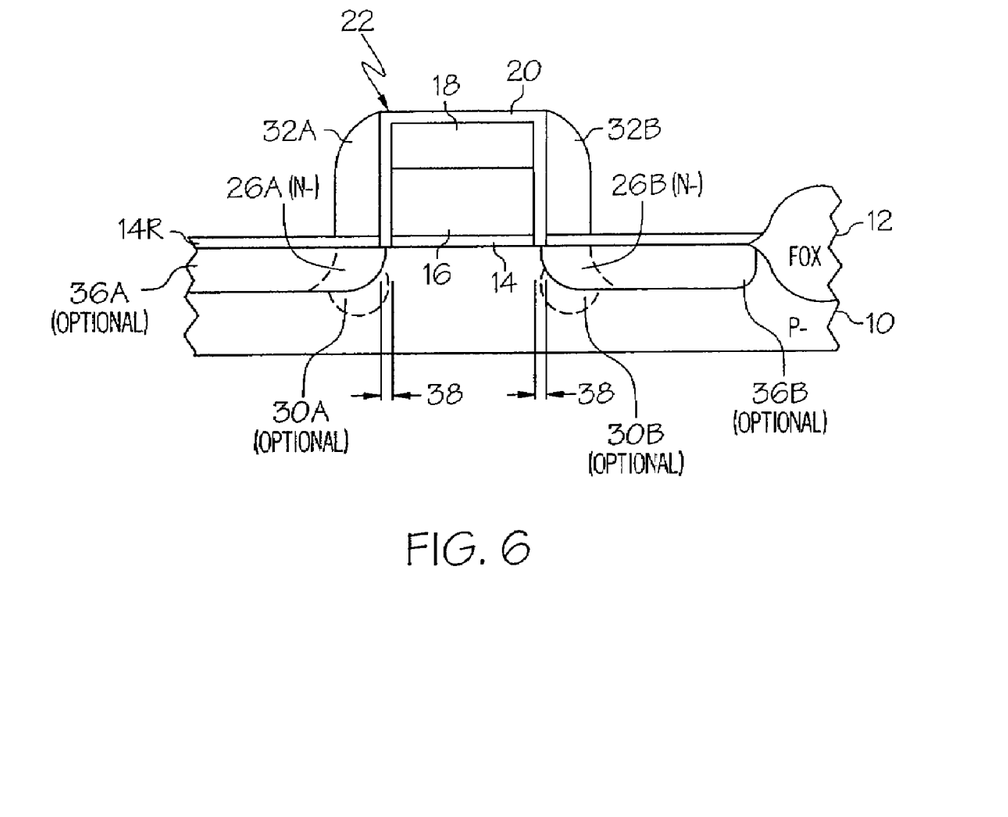

Heavily doped regions 36A and 36B are shown in FIG. 6. Spacers 32A and 32B prevent the second implant from diffusing beneath the gate structure 22, which helps in the formation of the individual diffusion regions 26A, 26B, 36A, and 36B.

As illustrated, a portion of each LDD region 26A and 26B slightly diffuse below the gate structure 22, which is referred to as the gate overlap region 38. Although the width of the gate overlap region is less than about 0.018 μm, the present invention addresses the problems associated with having gate overlap regions less than 0.018 μm found in the prior art, through the use of a two-layer doped conductor. The two-layer doped conductor according to the present invention forms a high dopant concentration in the source/drain regions close to their respective spacers 32A and 32B. A high dopant concentration in the source/drain regions proximate to each spacer is less susceptible to depletion by trapped charges in the gate oxide 14, thereby reducing junction leakage and also improving the refresh capabilities of DRAM devices.

Figure 7:
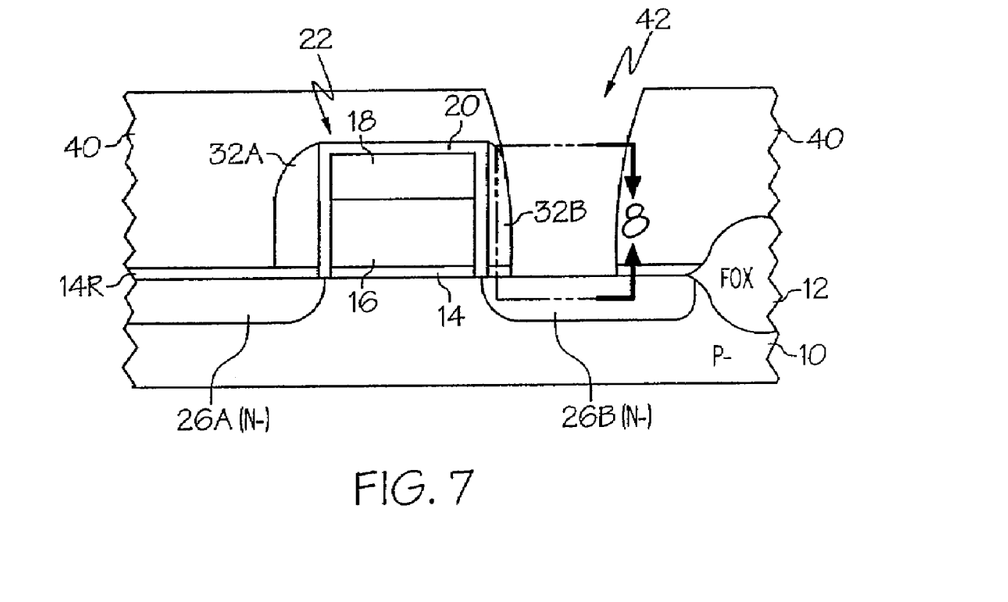

Referring to FIG. 7, formation of the two-layer doped conductor according to the present invention occurs at least after spacer formation, as the pocket implantation and the HDD region implant are optional to the formation of a DRAM device. After spacer formation (and other option known fabrication processes), the substrate 10 is annealed, for example, at a temperature of between about 850° C. to about 1100° C. for between about 0.2 to about 30 minutes, to drive out any impurities. An insulating layer 40, such as BPSG, is then deposited over the surface of the substrate 10. Contact openings, such as opening 42, are made through the insulating layer 40 to the underlying semiconductor devices, such as to LDD region 26B. The width of each contact opening is from about 0.10 μm to about 0.12 μm.

It is to be appreciated that with a contact opening 42 of slightly less than 0.11 μm, and in embodiments using an undoped polycrystalline material with a grain size slightly larger than about 0.1 μm to fill the opening, means in essence, that about one grain of the undoped polycrystalline material typically contacts the active area beneath the conductor. Additionally, dopants tend to segregate in the grain boundaries in the polycrystalline material. Furthermore, dopants tend to have higher diffusion in the grain boundaries than inside the grains. Accordingly, providing a doped polycrystalline material in accordance with the present invention, such as for example with arsenic, tends to have a smaller grain size, thereby providing more grains in contact with the active areas than with an undoped polycrystalline material. Since more grains are in contact with the active area beneath the doped conductor of the present invention, the out-diffusion of the dopant from the doped conductor creates a very highly doped, very shallow dopant region beneath the conductor, as will be explain in greater detail hereafter with references made to FIGS. 8a and 8b.

Figure 8A:
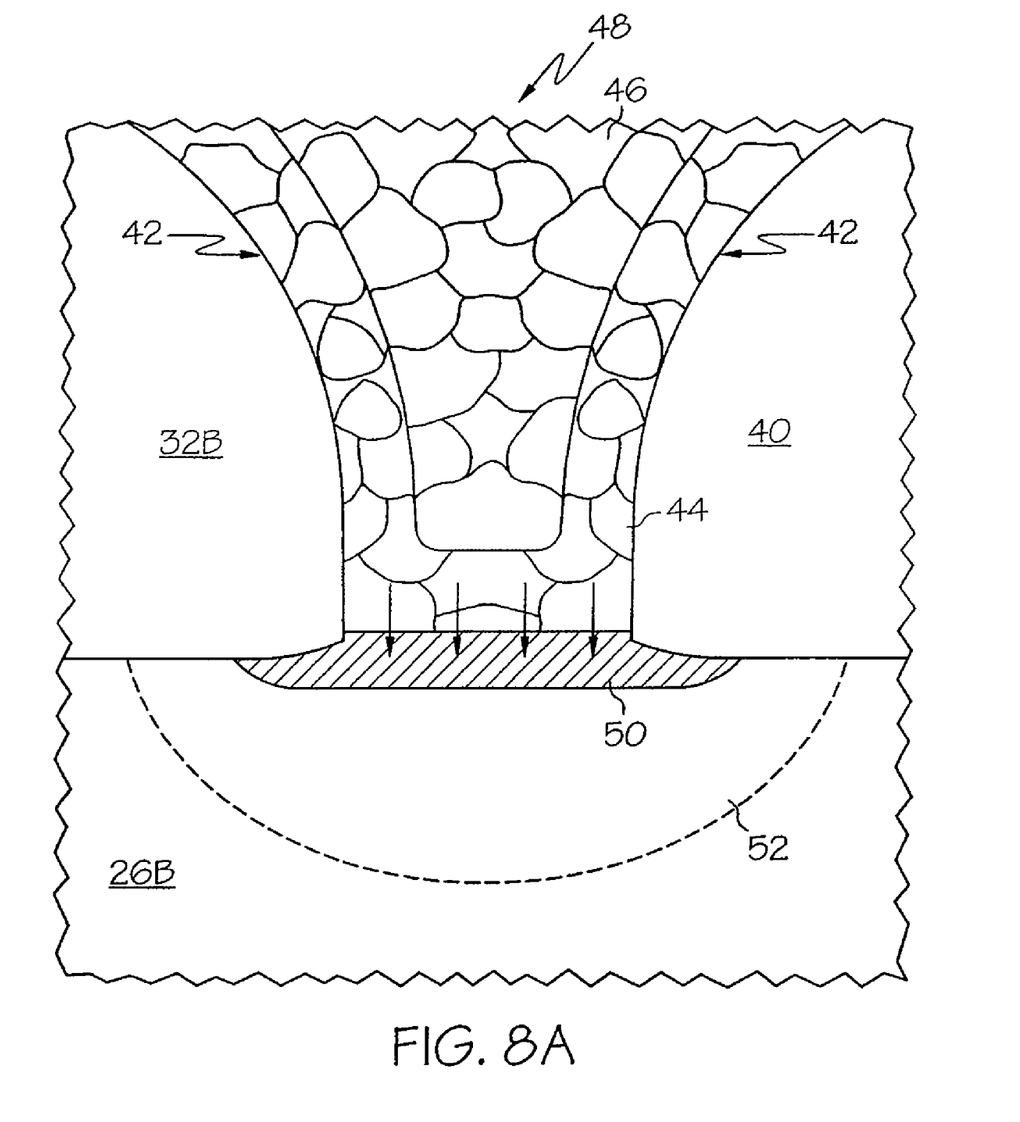
Figure 8B:
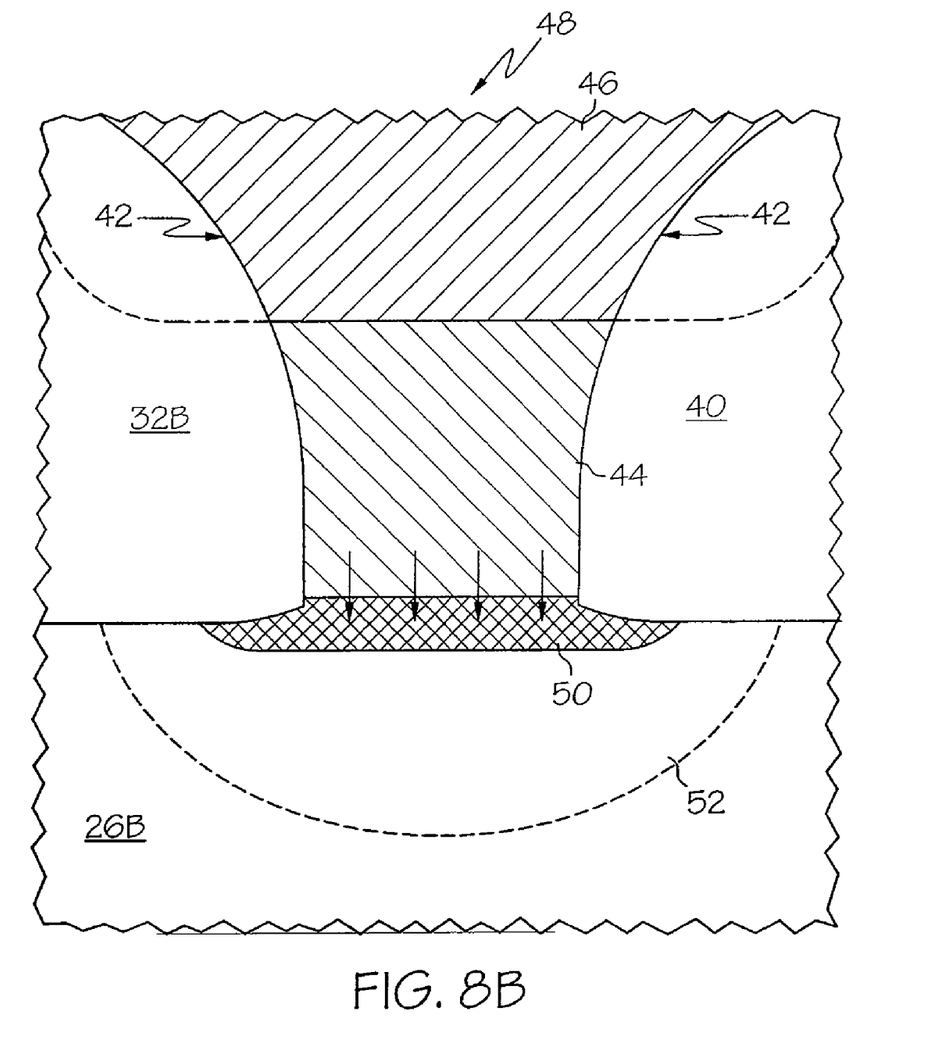

FIGS. 8a and 8b are enlarged fragmented views of the various embodiments of a multilayered doped conductive element or conductor, such as a plug, capacitor bottom plate, digitline contact, active area contact, and the like, formed according to the present invention. In one embodiment, after contact opening formation, about 100 to about 1000 Angstroms of a first conductive material is deposited with a first dopant in-situ to form a first doped conductive layer 44 in contact with LDD region 26B, which also lines or blankets at least the bottom portion of contact opening 42. The conductive material may be a semiconductor or crystalline material such as, for example, polysilicon, SiGe, and the like, that is doped or otherwise modified so that it may exhibit conductivity.

Figure 9:
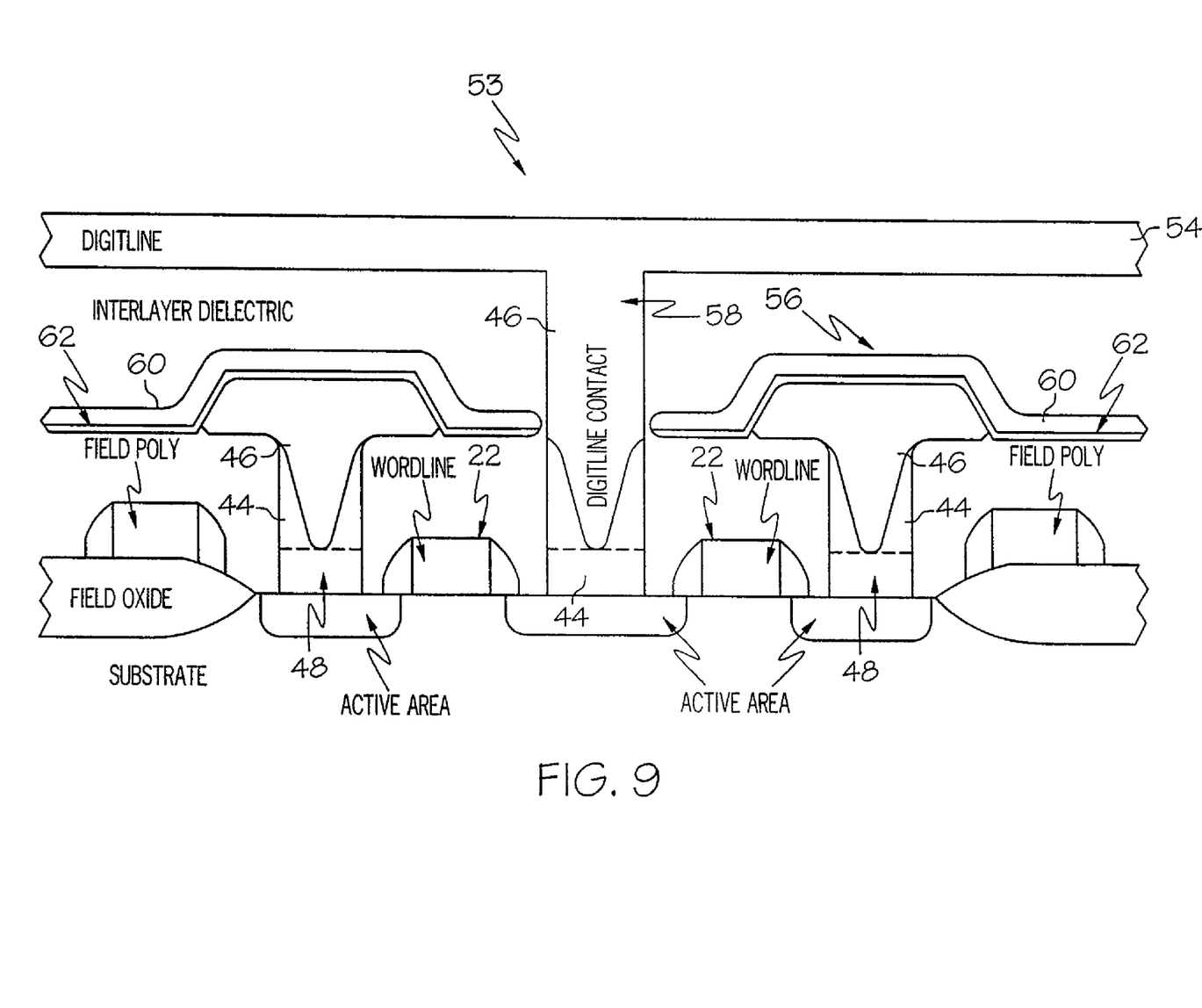
FIG. 9 is a buried capacitor memory bit cell cross section formed in accordance with the present invention.
Figure 10:
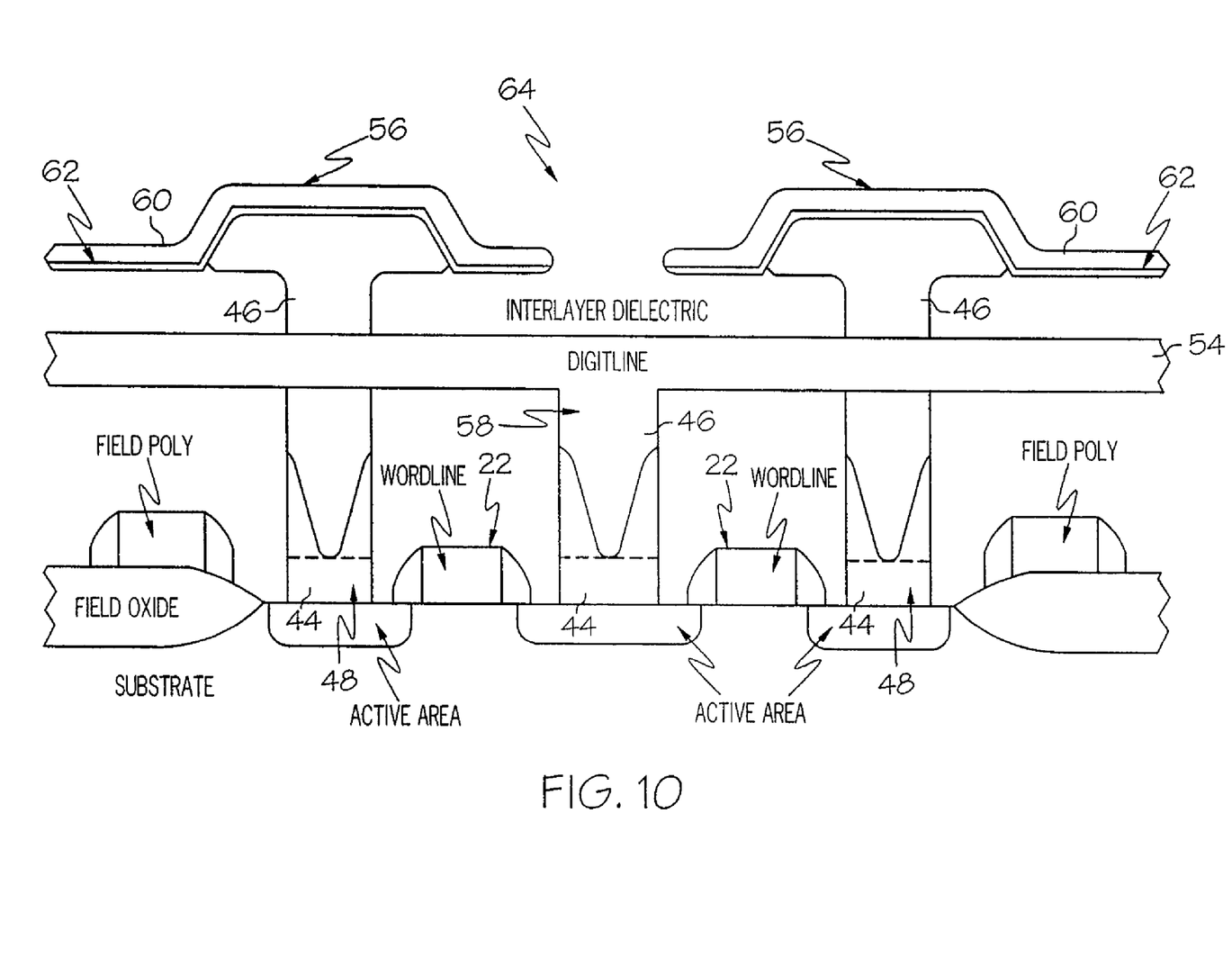
FIG. 10 is a buried digitline memory bit cell cross section formed in accordance with the present invention.

Next, a second conductive material is deposited with a second dopant in-situ to a thickness of about 2000 to about 2500 Angstroms on the first doped conductive layer 44, filling contact hole 42 with a second doped conductive layer 46. In one embodiment, first and second doped conductive layers 44 and 46 form a two-layered doped conductor 48. This embodiment of the invention is illustrated in FIG. 8a. In other embodiments, first and second doped conductive layers 4 and 46 may from a conductor, conductive element, or conductive component of an integrated circuit such as, for example, as illustrated by FIGS. 9 and 10, a bottom plate of a storage node 56 and/or digitline contact 58.

In another embodiment, the first conductive material is deposited in contact opening 42 to a thickness of from about 100 to about 1000 Angstroms, which is then implanted with the first dopant to form the first doped conductive layer 44. The first dopant is implanted at dosages of between about $1\times10^{14}$ to about $1\times10^{16}$ atoms/cm$^2$, and at energies of between about 1 to about 15 KeV at a vertical angle. The first doped conductive layer 44 has an average dopant concentration for ranging from about $1\times10^{19}$ ions/cm$^3$ to about $1\times10^{21}$ ions/cm$^3$.

Next, the second conductive material is deposited on the first doped conductive layer 44 to a thickness of from about 2000 to 2500 Angstroms, which is then implanted with the second dopant to form the second doped conductive layer 46. The second dopant is implanted at dosages of between about $1\times10^{14}$ to about $1\times10^{16}$ atoms/cm$^2$, and at energies of between about 1 to about 15 KeV at a vertical angle. The second doped conductive layer 46 has an average dopant concentration ranging from about $1\times10^{19}$ ions/cm$^3$ to about $1\times10^{21}$ ions/cm$^3$. In another embodiments, providing layers 42 and 44 may be according to a combination of the above-mentioned embodiments (e.g., in situ, doping, and combinations thereof).

In still another embodiment, the first conductive material can be either deposited with the first dopant in situ or later implanted as previously described above, to form the first doped conductive layer 44. Next, the first doped conductive layer 44 undergoes a selective dry etch to form a layer at the bottom of the contact opening 48, as illustrated in FIG. 8b, which does not line opening 42. In other embodiments, this selective dry etch can also be used to remove most of the sidewall 32B (indicated by dashed lines) in order to create a larger opening for the deposition of the second conductive layer, if desired. After dry etching, the second conductive material is then deposited with the second dopant in situ or later implanted as also previously described above to form the second doped conductive layer 46, and thereby forming the two-layer doped conductor 48.

In the dry etching embodiments, it is to be appreciated that the first conductive layer is deposited at a slightly larger thickness (about 15% larger) first to account for material removal during etch in order to have a final thickness of from about 2000 to 2500 Angstroms.

In still another embodiment, the first conductive material may be deposited without being doped insitu or implanted before the second conductive material is provided. In such an embodiment, after the second conductive material is provided, the first conductive layer receives its dopant by way of diffusion or implantation through the second conductive layer 46 with dosages and energies to achieve the above-mentioned concentration for the first doped conductive layer 44.

In the preferred embodiments, the first dopant diffusivity is less than the second dopant, such that a dopant-type diffusion region 50 is formed under the conductor 48 in a portion of LDD region 26B. This is due to solid-source diffusion from the first doped conductive layer 44 to LDD region 26B. Diffusion region 50 is very shallow, extending under the conductor 48 to a depth of no greater than about 0.02 μm into LDD region 26B. Further, diffusion region 50 extends partially under spacer 32B, but not beyond LDD region 26B. It is to be appreciated that by solid-source diffusion, the dopant concentration of the shallow diffusion region 50 is greater than the dopant concentration in LDD region 26B.

Moreover, because the second dopant has a higher diffusivity than the first dopant, the second dopant will also out diffuse from the second doped conductive layer 46 through the first doped conductive layer 44, and into the LDD region 26B. Accordingly, the second dopant will out diffuse beyond the shallow diffusion region 50 to provide, to some extent, a graded dopant concentration portion 52 to the junction between the spacer 32B, the LDD region 26B, and the shallow dopant-type region 50. As illustrated, the portion 52 also extends partially under the spacer 32B, but not beyond the LDD region 26B.

For NMOS, the first dopant is arsenic, antimony, or combinations thereof, and the second dopant is phosphorous. For PMOS, the first dopant may be boron and the second dopant $BF_2$ or vice-versa. By the above-described method of forming a multilayered doped conductor, device degradation due to increased trap states in the channel region can be mitigated. Several types of exemplary semiconductor integrated circuit devices employing the principles of the present invention will be described hereafter.

After conductor formation according to the methods of the present invention, the integrated circuit may be completed according to known fabrication methods. For example, in one embodiment, the structure may be completed to form a pair of DRAM memory cells, such as illustrated in FIGS. 9 and 10.

FIG. 9 is a process cross section for a pair of buried capacitor memory bits 53, which places a digitline 54 physically above a storage capacitor 56. The digitline 56 is constructed from metal, silicided polysilicon, polycided polysilicon and combinations thereof. The digitline contact 58 is formed using metal, polysilicon, or a two-layer doped conductor of the present invention, such as illustrated. The storage capacitor 56 is formed with the two-layer doped conductor 48 of the present invention as the bottom plate, an oxide-nitride-oxide (ONO) dielectric 60, and a sheet of polysilicon 62 which forms the common node or cell plate shared by all memory bit capacitors. The capacitor shape can be simple, such as a rectangle, or complex, such as concentric cylinders or stacked discs.

Additionally, the two-layer doped conductor 48 may be used in the other basic memory bit configuration used in the DRAM art, such as is illustrated in FIG. 10, which shows a pair of capacitor over bitline cells 64. Such memory bit configurations are useful in forming a number of different memory array designs, such as $8F^2$ and $6F^2$, which are disclosed in greater detail by commonly assigned U.S. Pat. No. 6,392,303, the disclosure of which is incorporated fully by reference, and which memory array designs may advantageously be improved with the two-layer doped conductor of the present invention.

Figure 11:
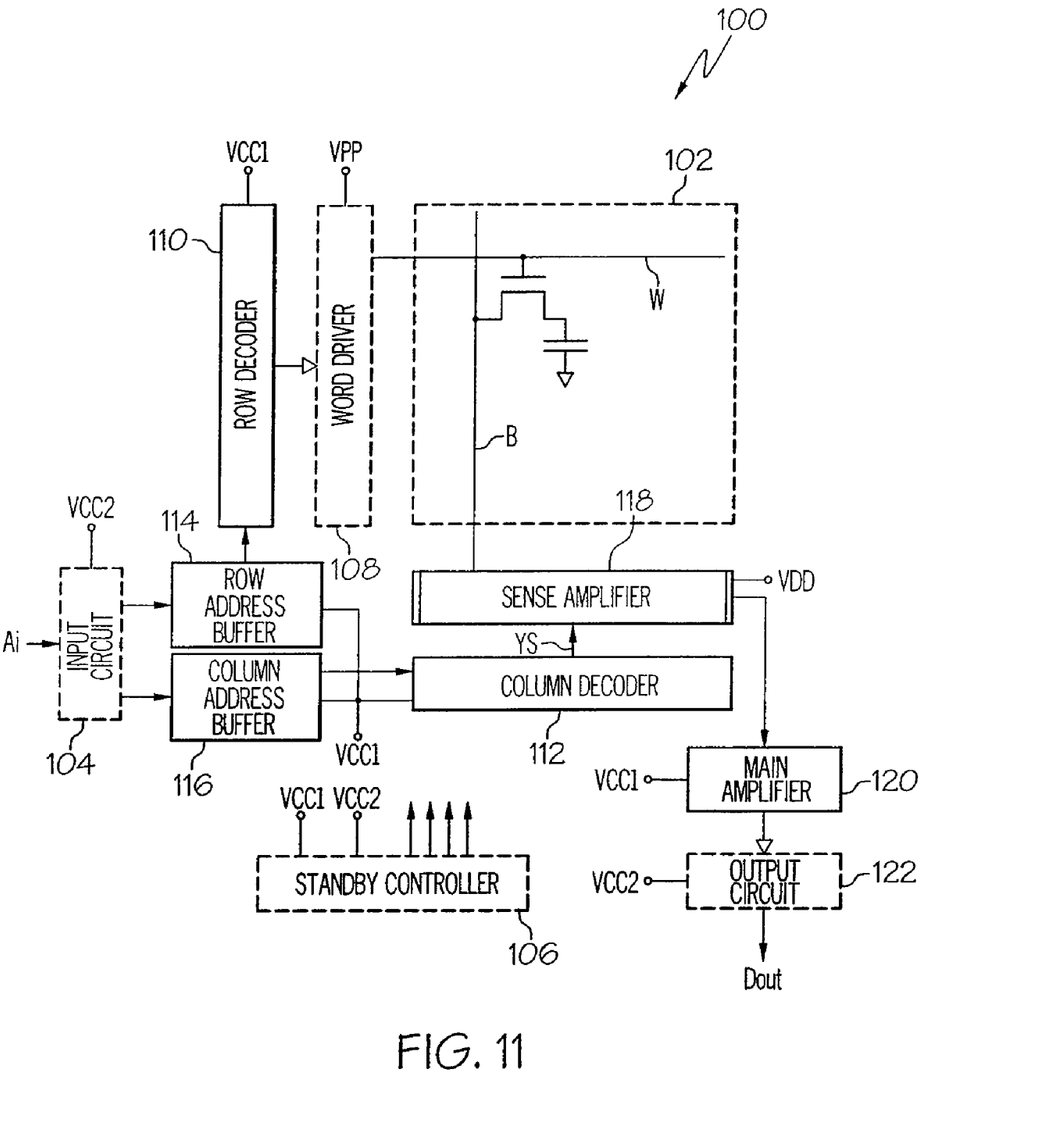
FIG. 11 is a block diagram of a DRAM device including a memory device formed in accordance with the present invention.

Such memory bit arrays having a two-layer doped conductor 48 of the present invention, may further be provided in a DRAM device 100, which is illustrated in FIG. 11. DRAM device 100 includes a memory array 102 which employs a plurality of MOS transistors 53 or 64 (FIGS. 9 and 10, respectively) formed with a plurality of two-layer doped conductors according to the present invention in order to prevent electrical charge from leaking out of an associated data storage capacitor. The remaining DRAM components are formed according to known fabrication methods. The DRAM device 100 as illustrated, further includes an I/O circuit 104, standby controller 106, and word driver 108, which are designed to operate with power supply voltages Vcc2, Vpp that are higher than Vcc1. For drive of the memory-cell transistors 102, word lines W are arranged to carry and handle large amplitude voltage signals from word driver 108.

The DRAM device 100 further includes row and column decoders 110 and 112, and address buffers 114 and 116. Decoders 110, 112 and address buffers 114, 116 handle small amplitude signals for drive by the low voltage Vcc1, supra.

A sense amplifier 118 is designed to operate voltages sensed from bit line B that are higher than power supply voltage Vdd.

When input circuit 104 receives at its input an address signal Ai, which is as great as Vcc2 in amplitude, this input signal is level-converted into a small Vcc1 amplitude signal, which is then passed to address buffers 114, 116 and decoders 110, 112. Although not visible in FIG. 11, row decoder 110 contains therein a level converter for converting the Vcc1 amplitude signal into an amplitude-increased signal (Vpp), which is then supplied to word driver 108. The column address YS is sent to the sense amplifier 118, which depending on the current operation the memory cell, will take on the state of the applied voltage. If a read operation, the sense amplifier 118 provides the sensed voltage signal of that memory to a main amplifier 120, which is then provided to output circuit 122. The sensed signal is amplified via power supply voltages Vcc1 and Vcc2.

Figure 12:
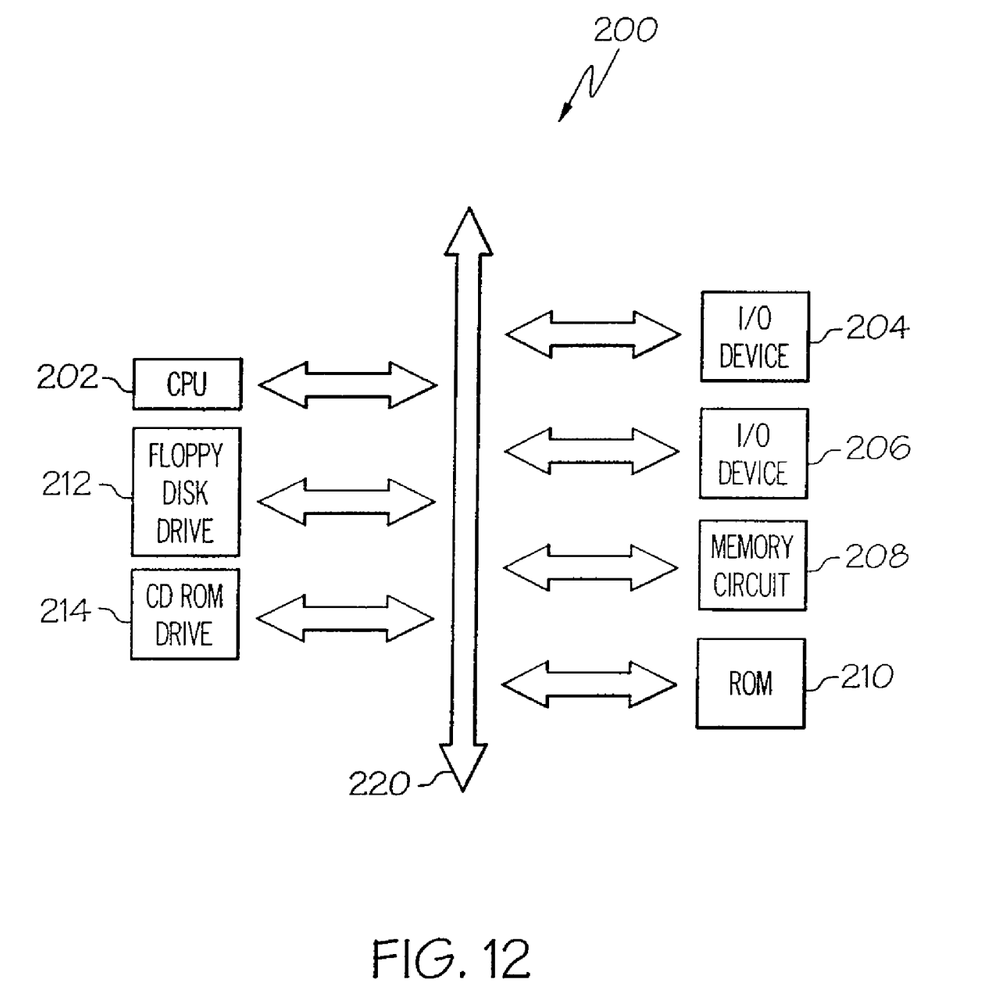
FIG. 12 is block diagram of a processor-based system including a memory device formed in accordance with the present invention.

A further embodiment of the invention is shown in FIG. 12, which illustrates a block diagram of a processor-based system 200 utilizing a DRAM memory circuit 208 constructed in accordance with the present invention. That is, the memory circuit 208 utilizes one of the MOSFET memory arrays 53 (FIG. 9) or 64 (FIG. 10) constructed in accordance with the present invention (FIGS. 1 to 8). The processor-based system 200 may be a computer system, a process control system, or any other system employing a processor and associated memory. The system 200 includes a central processing unit (CPU) 202, e.g., a microprocessor, which communicates with the DRAM memory circuit 208 and an I/O device 204 over a bus 220. It must be noted that the bus 220 may be a series of buses and bridges commonly used in a processor-based system, but for convenience purposes only, the bus 220 has been illustrated as a single bus.

A second I/O device 206 is illustrated, but is not necessary to practice the invention. The processor-based system 200 also includes a read-only memory (ROM) circuit 210 and may include peripheral devices such as a floppy disk drive 212 and a compact disk (CD) ROM drive 214 that also communicates with the CPU 202 over the bus 220 as is well known in the art. It should be noted that the CPU 202 could be combined on a single chip with one or more DRAM memory circuits 208 and ROM circuits 210.

While the invention has been described in detail in connection with a number of various embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed is:

1. A memory integrated circuit (IC) device having a channel region less than 0.18 µm and a gate overlap less than 0.018 µm, said device comprising:

multilayered doped conductor means addressing reliability of said memory IC device at burn-in which through diffusion created a shallow, dopant portion with high dopant concentration in an active area of said device beneath said conductor means and adjacent the channel region, said shallow, dopant portion being less susceptible to depletion of trapped charges in the channel region.

2. The device of claim 1, wherein said conductor means is a device feature selected from the group consisting of a plug, a capacitor bottom plate, a digitline contact, and an active area contact.

3. The device of claim 1, wherein said conductor means comprises a first conductive layer and a second conductive layer provided adjacent to said first conductive layer, said second conductive layer having a greater dopant concentration that said first conductive layer.

4. The device of claim 3, wherein said first conductive layer has a first dopant.

5. The device of claim 4, wherein said first dopant comprises arsenic, antimony, or combinations thereof.

6. The device of claim 4, wherein said first dopant comprises boron, boron bifluoride, borane, or combination thereof.

7. The device of claim 3, wherein said second conductive layer has a second dopant.

8. The device of claim 7, wherein said second dopant comprises phosphorus.

9. The device of claim 7, wherein said second dopant comprises boron, boron bifluoride, borane, or combination thereof.

10. The device of claim 3, wherein said first conductive layer is in contact with a lightly doped source/drain regions.

11. The device of claim 3, wherein said conductor means is located adjacent a transistor.

12. The device of claim 3 wherein said first conductive layer lines a contact opening.

13. The device of claim 3 wherein said first conductive layer has an average dopant concentration ranging from about $1 \times 10^{19}$ to about $1 \times 10^{21}$ ions/cm$^3$.

14. The device of claim 3 wherein said second conductive layer has an average dopant concentration ranging from about $1 \times 10^{19}$ to about $1 \times 10^{21}$ ions/cm$^3$.

15. A memory integrated circuit (IC) device having a channel region less than 0.18 μm and a gate overlap less than 0.018 μm, said device comprising:

a shallow, dopant portion with high dopant concentration in an active area of said device, said shallow, dopant portion being less susceptible to depletion of trapped charges in the channel region.

16. The device of claim 15, wherein said shallow, dopant portion is beneath a conductor and adjacent the channel region.

17. The device of claim 15 wherein said shallow, dopant portion extends to a depth of no greater than about 0.02 μm in said active region.

18. The device of claim 15 wherein said shallow, dopant portion extends partially under a spacer provided adjacent a transistor.

19. A memory integrated circuit (IC) device having a channel region less than 0.18 μm and a gate overlap less than 0.018 μm, said device comprising:

multilayered doped conductor means addressing reliability of said memory IC device at burn-in which through diffusion created a shallow, dopant portion with high dopant concentration in an active area of said device beneath said conductor means and adjacent the channel region, said shallow, dopant portion being less susceptible to depletion of trapped charges in the channel region, wherein said multilayered doped conductor means comprises a first dopant within a first conductive layer and a second dopant within a second conductive layer, wherein said second conductive layer is provided adjacent to said first conductive layer and wherein said second conductive layer has a greater dopant concentration that said first conductive layer.

20. The device of claim 19, wherein said first conductive layer has a thickness of about 100 Angstroms to about 1000 Angstroms and said second conductive layer has a thickness of about 2000 Angstroms to about 2500 Angstroms.

* * * * *